(12) United States Patent
Yang et al.

(45) Date of Patent: Sep. 28, 2010
(10) Patent No.: US 7,804,166 B2

(54) INTEGRATED CIRCUIT PACKAGE SYSTEM WITH STACKING MODULE

(75) Inventors: Joungin Yang, Koyang (KR); YoungSik Cho, Hwasung-si (KR); Nam Ju Cho, Uiwang-si (KR)

(73) Assignee: Stats Chippac Ltd., Singapore (SG)

( * ) Notice: Subject to any disclaimer, the term of this patent is extended or adjusted under 35 U.S.C. 154(b) by 233 days.

(21) Appl. No.: 12/053,760

(22) Filed: Mar. 24, 2008

(65) Prior Publication Data
US 2009/0236754 A1 Sep. 24, 2009

(51) Int. Cl.
*H01L 23/02* (2006.01)
(52) U.S. Cl. .......... 257/686; 257/730; 257/777; 257/724; 257/E23.123; 257/E21.505; 257/679; 438/107; 438/109; 438/126
(58) Field of Classification Search ............ 257/686, 257/730, 777, 724, E23.123, E21.505, 679; 438/107, 109, 126
See application file for complete search history.

(56) References Cited

U.S. PATENT DOCUMENTS

| 6,278,177 | B1 | 8/2001 | Ryu | |
|---|---|---|---|---|
| 6,383,838 | B2 | 5/2002 | Ryu | |
| 7,169,642 | B2 * | 1/2007 | Karnezos | 438/108 |
| 7,253,511 | B2 | 8/2007 | Karnezos et al. | |
| 7,274,095 | B2 | 9/2007 | Fee et al. | |
| 2004/0066693 | A1 * | 4/2004 | Osako et al. | 365/222 |
| 2007/0052082 | A1 | 3/2007 | Lee et al. | |
| 2007/0267732 | A1 * | 11/2007 | Tan et al. | 257/679 |

* cited by examiner

*Primary Examiner*—Tu-Tu V Ho
(74) *Attorney, Agent, or Firm*—Mikio Ishimaru (57) ABSTRACT

An integrated circuit package system includes: providing a module substrate having dimension predetermined for attachment adjacent a device; attaching a module die adjacent the module substrate; and applying a module molding material cantilevered from the module substrate and over the module die.

20 Claims, 7 Drawing Sheets

INTEGRATED CIRCUIT PACKAGE SYSTEM WITH STACKING MODULE

TECHNICAL FIELD

The present invention relates generally to integrated circuit packages and more particularly to integrated circuit package systems with stacking modules.

BACKGROUND ART

Electronic devices have permeated virtually all aspects of modern life. These electronic devices can be embedded in products such as telephones, kitchen appliances, televisions, automobiles, and many other products that require controls, displays, or information storage in small devices or spaces.

Electronic devices require integrated circuits contained within chips or die to perform various functions for the products we use. As these products include more features or become smaller, the demands for packaging the integrated circuits become increasingly difficult to achieve.

The reduction in size of the circuitry has not been able to keep pace with these demands. This has caused larger integrated circuits as well as combining multiple integrated circuits within a single integrate circuit package. The integrated circuits can be arrayed, stacked, or both.

Stacking integrated circuits or modules with integrated circuits require significant spacing for electrical connections to other components within a package or to the base package itself. The increased spacing results in a significantly larger height or z-dimension of the overall package.

Many attempts have failed to control this "roof" height. In some attempts, electrical connectors are exposed resulting in poor reliability or failures due in part to damage. In other attempts in which the electrical connectors are covered damage can still occur during assemble due in part to assembling components with close spacing to other components.

Attempts to avoid damage due to close spacing have resulted in the overall package dimensions to grow. Often a spacer is inserted to protect electrical connectors resulting in both larger dimensions and unusable area within the package.

Thus, a need still remains for improving packaging density while maintaining reliability, yield, and manufacturing throughput to improve features, performance and control costs in systems for integrated circuit packages.

In view of the ever-increasing commercial competitive pressures, along with growing consumer expectations and the diminishing opportunities for meaningful product differentiation in the marketplace, it is critical that answers be found for these problems.

Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention includes: providing a module substrate having dimension predetermined for attachment adjacent a device; attaching a module die adjacent the module substrate; and applying a module molding material cantilevered from the module substrate and over the module die.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Figure 1:
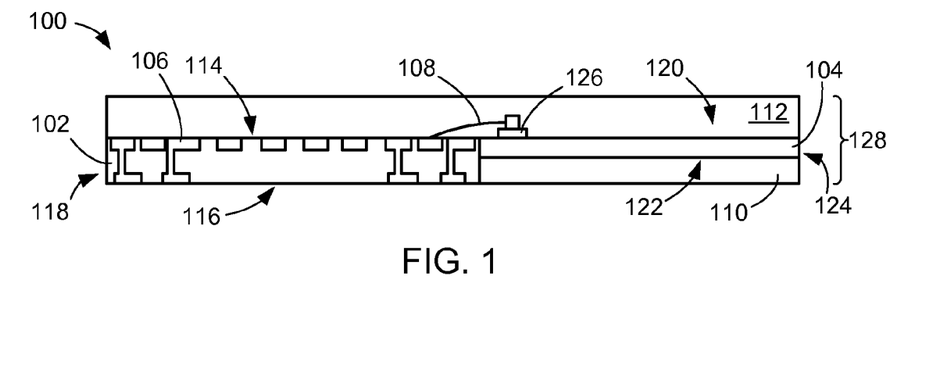
FIG. 1 is a cross-sectional view of an integrated circuit package system in a first embodiment of the present invention.

Referring now to FIG. 1, therein is shown a cross-sectional view of an integrated circuit package system 100 in a first embodiment of the present invention. The integrated circuit package system 100 preferably includes a module substrate 102 adjacent or offset a module die 104 for stacking over the module substrate 102 and the module die 104.

The module die 104 such as an integrated circuit including a memory device can be electrically connected to module substrate conductors 106 with a module die connector 108 and attached over a module die attach material 110. The module die attach material 110 such as adhesive, tape, or other material provides a mounting surface for the module die 104.

A module molding material 112 can cover and protect the module die 104, the module die connector 108, and part of the module substrate 102. The module molding material 112 can commonly be formed of an electrical insulator although the module molding material 112 can provide thermal conductivity.

The module molding material 112 can be cantilevered from the module substrate 102 and over the module die 104. The module molding material 112 can cover, protect, or provide structural integrity to part of the module substrate 102, the module die 104, or the module die connector 108.

The module substrate 102 includes a module substrate internal surface 114, a module substrate external surface 116, and a module substrate edge 118. The module substrate conductors 106 can provide electrical connectivity near the module substrate internal surface 114 or the module substrate external surface 116.

The module substrate conductors 106 can be formed of any conductive material or combination thereof. The module substrate conductors 106 can also provide connectivity or routing through the module substrate 102 including near the module substrate internal surface 114 or the module substrate external surface 116.

The module die 104 includes a module die connect surface 120, a module die mount surface 122, and a module die edge 124. The module die connect surface 120 can include module die conductors 126 such as conductive pads. The module die connector 108 can connect the module die conductors 126 and the module substrate conductors 106 near the module substrate internal surface 114.

The module die edge 124 having substantially vertical surface can be adjacent the module substrate edge 118 also having a substantially vertical surface. For illustrative purposes, the module die edge 124 is shown next to or facing the module substrate edge 118 although it is understood that there may be space between or overlap of the module die edge 124 and the module substrate edge 118.

The integrated circuit package system 100 can provide a stack module 128 including the module molding material 112. The stack module 128 preferably includes the module molding material 112 over part of the module substrate 102, the module die connector 108, and the module die 104 over the module die attach material 110 of the integrated circuit package system 100. The molding material 112 is directly on substantially all of the module substrate internal surface 114 and substantially all of the module die connect surface 120.

It has been unexpectedly discovered that the integrated circuit package system 100 having the module die 104 adjacent the module substrate 102 provides a significantly lower height particularly for stacking. Forming the module molding material cantilevered from the module substrate 102 and over the module die 104 can provide structural integrity as well as stacking over the module die 104 and the module substrate 102.

Figure 2:
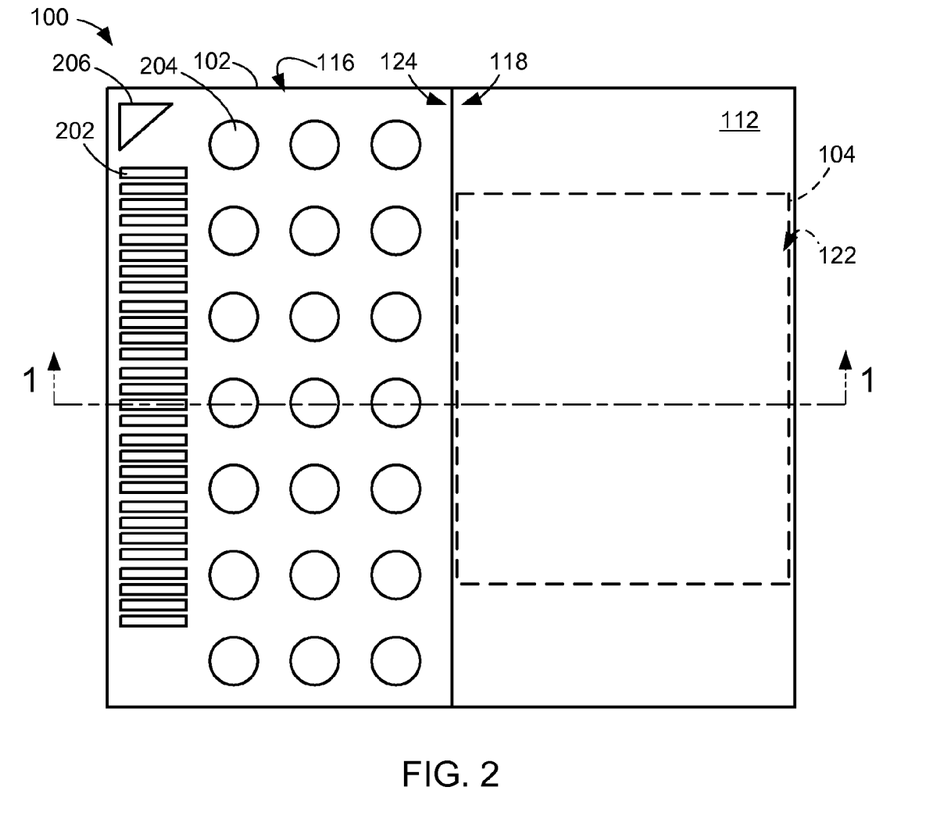
FIG. 2 is a bottom plan view of the integrated circuit package system.

Referring now to FIG. 2, therein is shown a bottom plan view of the integrated circuit package system 100. The integrated circuit package system 100 is shown without the module die attach material 110 of FIG. 1 for clarity.

The integrated circuit package system 100 preferably includes the module substrate external surface 116 of the module substrate 102 and the module die mount surface 122 of the module die 104. The module substrate edge 118 can be adjacent or offset the module die edge 124.

The module substrate conductors 106 of FIG. 1 can include substrate bond pads 202 and substrate connection pads 204 such as test pads or system pads. The substrate bond pads 202 can provide electrical connectivity to a next level system such as another package or subsystem board with connectors such as bond wires, planar interconnect, other conductors, or combination thereof.

Similarly, the substrate connection pads 204 can provide connectivity to other subsystems including test systems. The substrate connection pads 204 can also provide compatibility with fixture pins, solder balls, other conductors, or combination thereof.

The module substrate external surface 116 can optionally include a process feature 206. The process feature 206 can provide compatibility with manufacturing equipment during processing.

Figure 3:
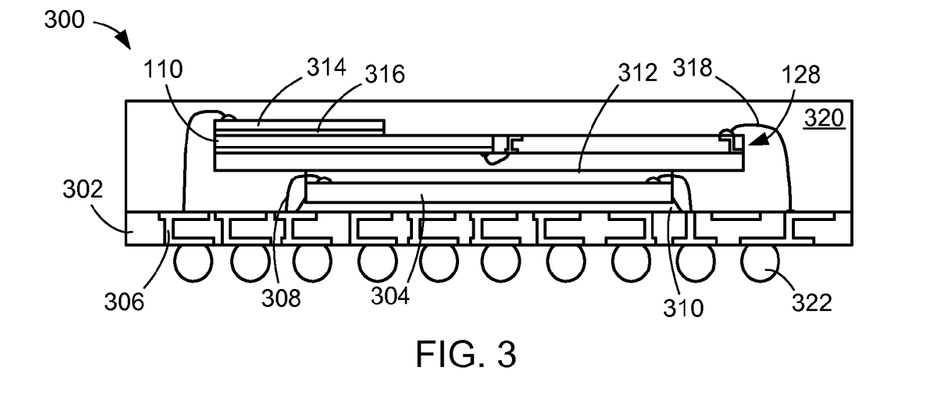
FIG. 3 is a cross-sectional view of an integrated circuit package system in a second embodiment of the present invention.

Referring now to FIG. 3, therein is shown a cross-sectional view of an integrated circuit package system 300 in a second embodiment of the present invention. The integrated circuit package system 300 preferably includes a package substrate 302 with a package die 304 thereover.

The package die 304 can be electrically connected to package substrate conductors 306 with package die connectors 308 and attached over a package die attach material 310. The package die attach material 310 such as an adhesive, a tape, or other material provides a mounting surface for the package die 304.

The stack module 128 can be attached or mounted over the package die 304 with a module interface material 312 such as a spacer, an adhesive, or a wire in film material. Similarly a stack device 314 such as a integrated circuit including an analog device can be attached or mounted over the module die attach material 110 with a device interface material 316.

Stack connectors 318 can electrically connect the stack module 128 or the stack device 314 to the package substrate conductors 306 of the package substrate 302. For illustrative purposes, the stack connectors 318 are shown as bond wires although it is understood that the stack connectors 318 may be of any connector technology or combination of technologies.

A package encapsulant 320 can be formed over the stack module 128, the stack connectors 318, the package die 304, the package die connectors 308, and part of the package substrate 302. Package connectors 322 can also be attached over a side of the package substrate 302 opposite the package encapsulant 320. The package connectors 322 can provide electrical connectivity to a next level system such as another package or printed circuit board.

Figure 4:
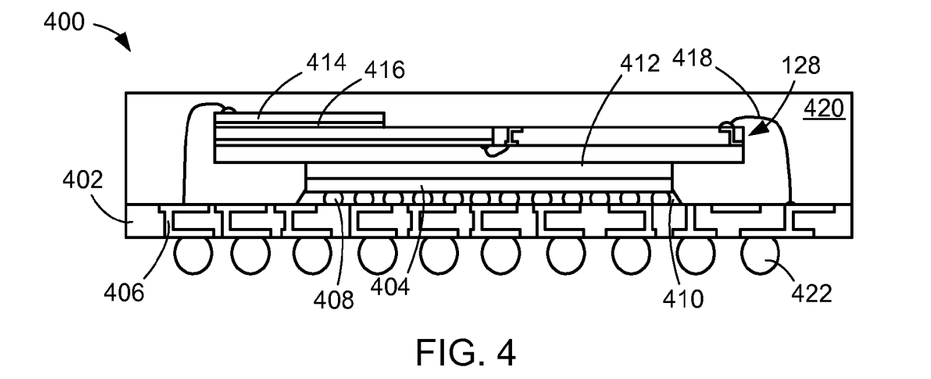
FIG. 4 is a cross-sectional view of an integrated circuit package system in a third embodiment of the present invention.

Referring now to FIG. 4, therein is shown a cross-sectional view of an integrated circuit package system 400 in a third embodiment of the present invention. The integrated circuit package system 400 preferably includes a package substrate 402 with a package die 404 thereover.

The package die 404 such as a flip chip can be electrically connected to package substrate conductors 406 with package die connectors 408 such as flip chip solder bumps and a package die interface 410. The package die interface 410 such as an underfill can provide structural integrity to the package die connectors 408.

The stack module 128 can be attached or mounted over the package die 404 with a module interface material 412 such as a spacer, an adhesive, or a wire in film material. Similarly a stack device 414 such as a integrated circuit including an analog device can be attached or mounted over the module die attach material 110 with a device interface material 416.

Stack connectors 418 can electrically connect the stack module 128 or the stack device 414 to the package substrate conductors 406 of the package substrate 402. For illustrative purposes, the stack connectors 418 are shown as bond wires although it is understood that the stack connectors 418 may be of any connector technology or combination of technologies.

A package encapsulant 420 can be formed over the stack module 128, the stack device 414 the stack connectors 418, the package die 404, the package die connectors 408, and part of the package substrate 402. Package connectors 422 can also be attached over a side of the package substrate 402 opposite the package encapsulant 420. The package connectors 422 can provide electrical connectivity to a next level system such as another package or printed circuit board.

Figure 5:
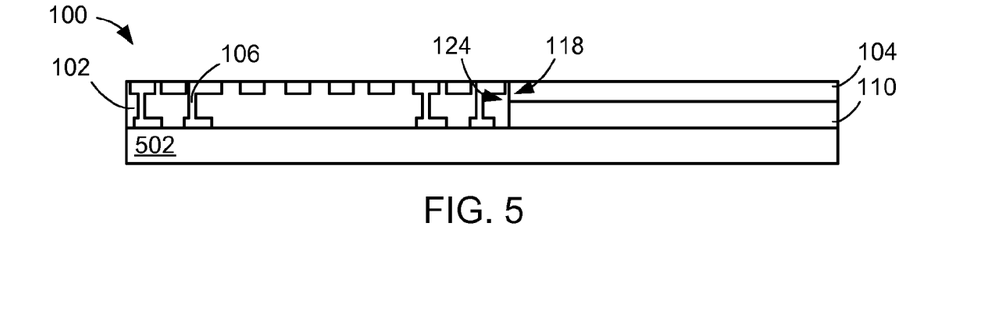
FIG. 5 is a cross-sectional view of the integrated circuit package system in an attachment phase.

Referring now to FIG. 5, therein is shown a cross-sectional view of the integrated circuit package system 100 in an attachment phase. The integrated circuit package system 100 preferably includes the module substrate 102 over a base material 502 such as a base tape or other material structural material.

The module die attach material 110 can also be applied over the base material 502. The module die 104 can be mounted over the module die attach material 110 and adjacent or next to the module substrate 102 having the module die edge 124 next to or facing the module substrate edge 118.

Figure 6:
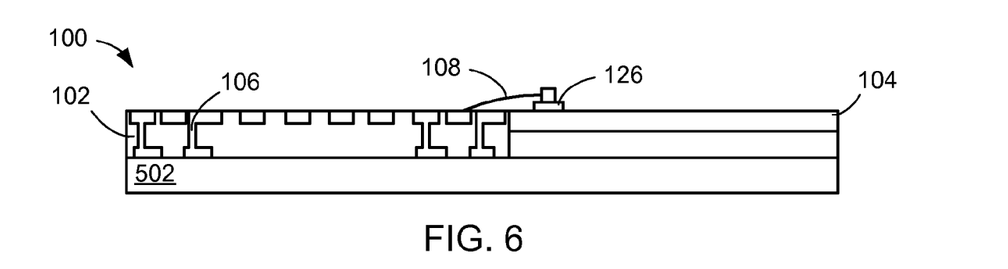
FIG. 6 is the structure of FIG. 5 in a connection phase.

Referring now to FIG. 6, therein is shown the structure of FIG. 5 in a connection phase. The module substrate 102 and the module die 104 can be held in substantially fixed positions over the base material 502 during processing such as wire bonding, interconnect soldering or other connector attachment process.

The module die connector 108 can connect the module die conductors 126 of the module die 104 and the module substrate conductors 106 of the module substrate 102. The module die connector 108 can provide electrical connectivity for the module die 104 to a next level system through the module substrate conductors 106.

Figure 7:
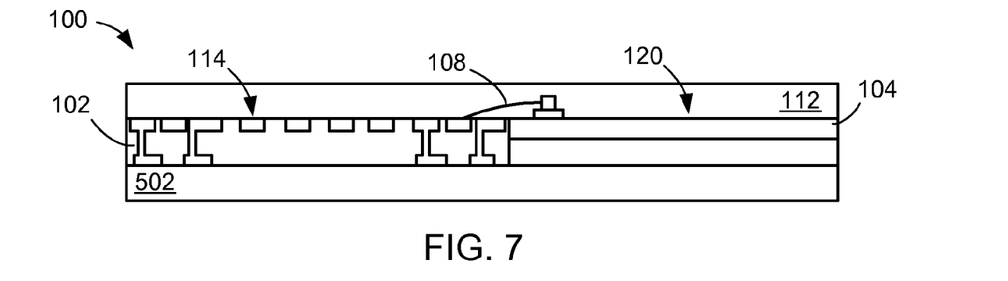
FIG. 7 is the structure of FIG. 6 in an encapsulation phase.

Referring now to FIG. 7, therein is shown the structure of FIG. 6 in an encapsulation phase. A process such as encapsulation or molding can be applied to the module substrate 102, the module die 104, and the module die connector 108.

The module molding material 112 can be applied or formed over the module substrate internal surface 114, the module die connect surface 120, and the module die connector 108. The module molding material 112 can cover, protect, or provide structural integrity to part of the module substrate 102, the module die 104, or the module die connector 108.

Figure 8:
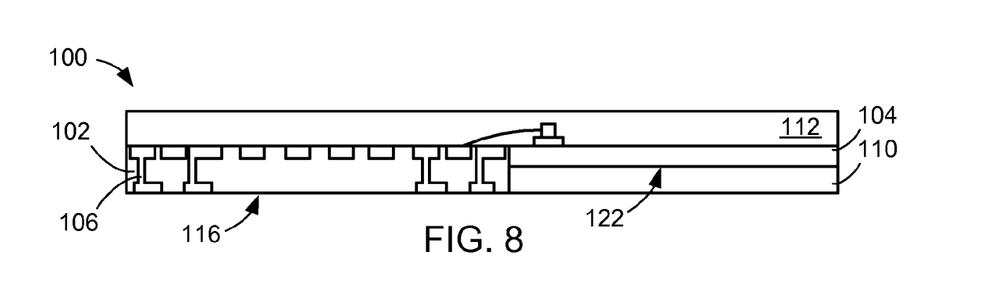
FIG. 8 is the structure of FIG. 7 in a removal phase.

Referring now to FIG. 8, therein is shown the structure of FIG. 7 in a removal phase. The integrated circuit package system 100 is shown without the base material 502 as shown in FIG. 7. The module molding material 112 can provide structural integrity of the module substrate 102, the module die 104, or the module die connector 108 without the need for the base material 502.

The module substrate external surface 116 and the module die attach material 110 can be substantially exposed for connectivity, connecting, attaching, or mounting of devices, components, or a next level system. The module substrate conductors 106 near the module substrate external surface 116 can also be substantially exposed.

Figure 9:
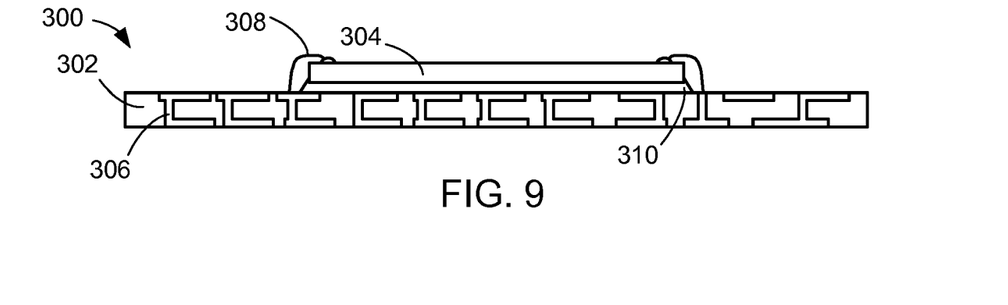
FIG. 9 is a cross-sectional view of the integrated circuit package system in an attachment phase.

Referring now to FIG. 9, therein is shown a cross-sectional view of the integrated circuit package system 300 in an attachment phase. The integrated circuit package system 300 preferably includes the package substrate 302 with the package die 304 thereover.

The package die 304 can be electrically connected to the package substrate conductors 306 with the package die connectors 308 and attached over the package die attach material 310. The package die attach material 310 provides a substantially fixed position for processing.

Figure 10:
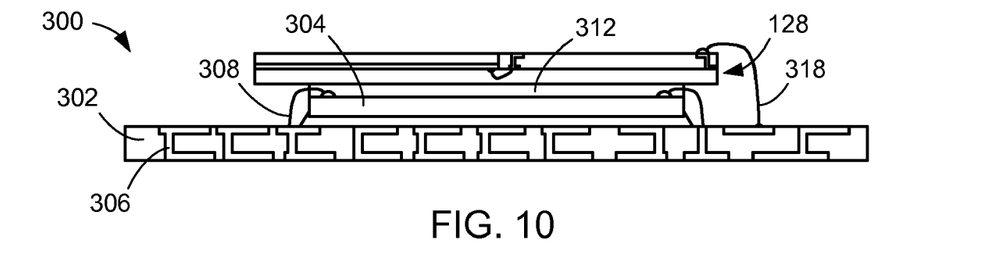
FIG. 10 is the structure of FIG. 9 in a module attach phase.

Referring now to FIG. 10, therein is shown the structure of FIG. 9 in a module attach phase. The module interface material 312 can attach or mount the stack module 128 over the package die 304. The module interface material can cover or protect a portion of the package die connectors 308.

The stack connectors 318 can electrically connect the stack module 128 to the package substrate conductors 306 of the package substrate 302. The stack module 128 can thereby be electrically connected through the package substrate 302.

Figure 11:
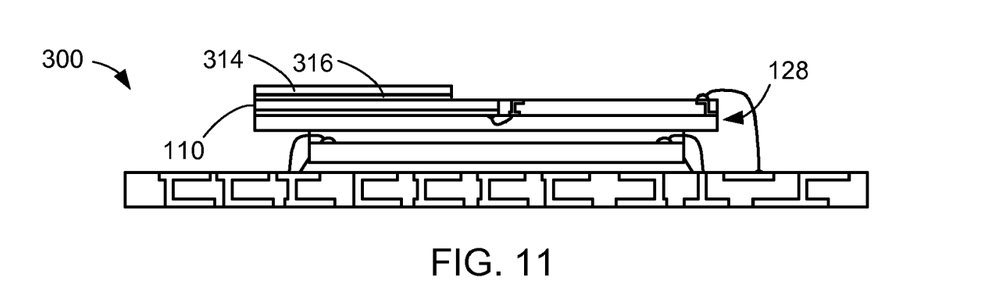
FIG. 11 is the structure of FIG. 10 in a device mount phase.

Referring now to FIG. 11, therein is shown the structure of FIG. 10 in a device mount phase. The stack device 314 can be attached or mounted over the module die attach material 110 with the device interface material 316. The device interface material 316 can be applied on the stack device 314 and the module die attach material 110.

The stack module 128 can provide the module die attach material 110 substantially exposed although the module die attach material 110 may or may not include adhesive properties during this phase.

Figure 12:
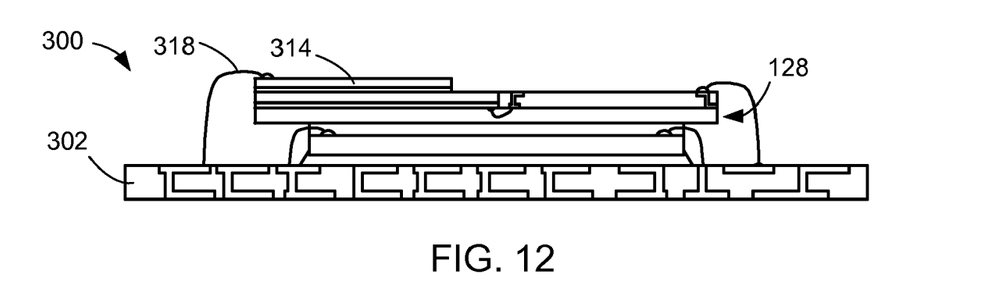
FIG. 12 is the structure of FIG. 11 in a device connect phase.

Referring now to FIG. 12, therein is shown the structure of FIG. 11 in a device connect phase. The stack connectors 318 can electrically connect the stack device 314 and the package substrate 302.

For illustrative purposes the stack connectors 318 attached to the stack device 314 are shown as substantially the same as the stack connectors 318 attached to the stack module 128 although it is understood that the stack connectors 318 attached to the stack device 314 may be different from the stack connectors 318 attached to the stack module 128.

Figure 13:
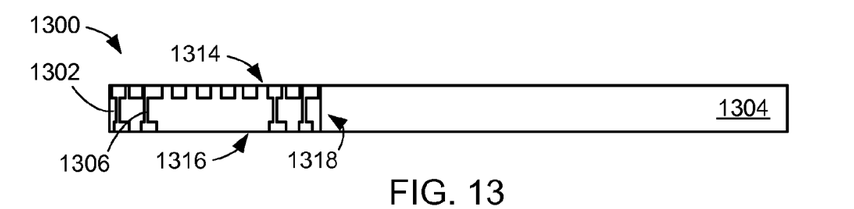
FIG. 13 is a cross-sectional view of an integrated circuit package system in a preparation phase of a fifth embodiment of the present invention.

Referring now to FIG. 13, therein is shown a cross-sectional view of an integrated circuit package system 1300 in a preparation phase of a fifth embodiment of the present invention. The integrated circuit package system 1300 preferably includes a module substrate 1302 adjacent or next to a base material 1304 such as a base tape or other material structural material.

The module substrate 1302 includes module substrate conductors 1306, a module substrate internal surface 1314, a module substrate external surface 1316, and a module substrate edge 1318. The module substrate 1302 can be formed and assembled to provide stacking over the module substrate internal surface 1314 or the module substrate external surface 1316.

Figure 14:
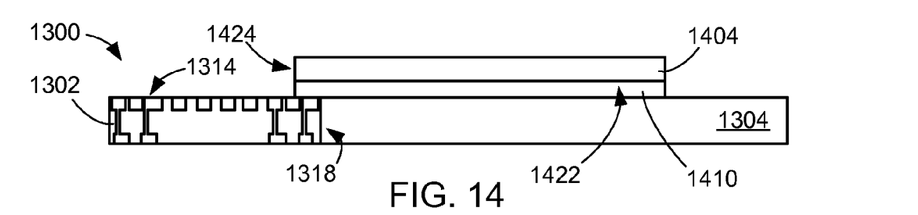
FIG. 14 is the structure of FIG. 13 in a mount phase.

Referring now to FIG. 14, therein is shown the structure of FIG. 13 in a mount phase. A module die 1404 can be attached or mounted over the base material 1304 and partially over the module substrate 1302 with a module die attach material 1410.

The module die 1404 includes a module die connect surface 1420, a module die mount surface 1422, and a module die edge 1424. The module die mount surface 1422 can overlap the module substrate 1302 although the module substrate internal surface 1314 can be substantially exposed.

Figure 15:
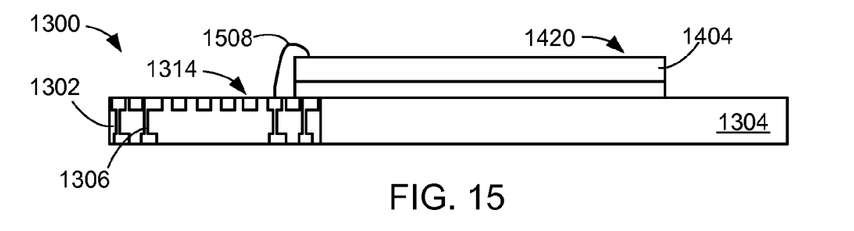
FIG. 15 is the structure of FIG. 14 in a connection phase.

Referring now to FIG. 15, therein is shown the structure of FIG. 14 in a connection phase. The module die 1404 can be electrically connected to the module substrate conductors 1306 with a module die connector 1508.

The module die connector 1508 provides electrical connectivity for the module die 1404 through the module substrate 1302 with the module substrate conductors 1306 and thereby a next level subsystem.

Figure 16:
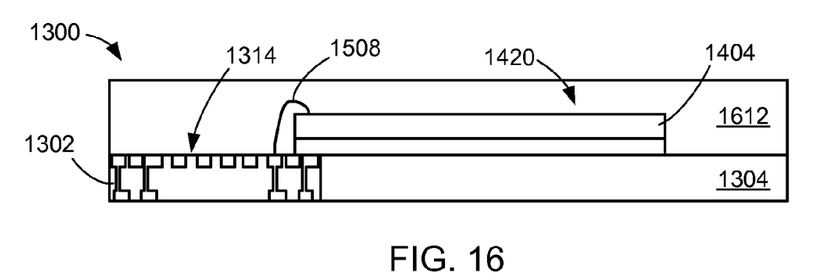
FIG. 16 is the structure of FIG. 15 in an encapsulation phase.

Referring now to FIG. 16, therein is shown the structure of FIG. 15 in an encapsulation phase. The module substrate 1302, the module die 1404, and the module die connector 1508 can be held in substantially fixed positions over the base material 1304 during processing such as molding or encapsulating.

A module molding material 1612 can be applied or formed over the module substrate internal surface 1314, the module die connect surface 1420, and the module die connector 1508. The module molding material 1612 can cover, protect, or provide structural integrity to part of the module substrate 1302, the module die 1404, or the module die connector 1508.

The module molding material 1612 can be cantilevered from the module substrate 1302 and over the module die 1404. The module molding material 1612 can commonly be formed of an electrical insulator although the module molding material 1612 can provide thermal conductivity.

Figure 17:
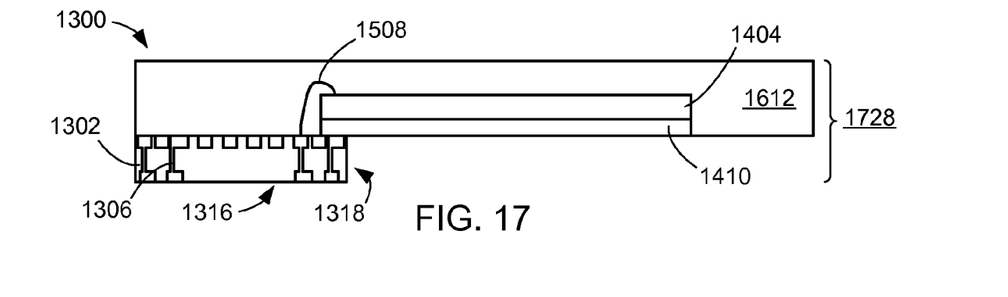
FIG. 17 is the structure of FIG. 16 in a removal phase.

Referring now to FIG. 17, therein is shown the structure of FIG. 16 in a removal phase. The integrated circuit package system 1300 is shown without the base material 1304 as shown in FIG. 16. The module molding material 1612 cantilevered from the module substrate 1302 and over the module die 1404 can provide structural integrity without the need for the base material 1304.

The module substrate external surface 1316 and the module die attach material 1410 can be substantially exposed for connectivity, connecting, attaching, or mounting of devices, components, or a next level system. The module substrate conductors 1306 near the module substrate external surface 1316 can also be substantially exposed.

The integrated circuit package system 1300 can provide a stack module 1728. The stack module 1728 preferably includes the module molding material 1612 over part of the module substrate 1302, the module die connector 1508, and the module die 1404 over the module die attach material 1410.

Figure 18:
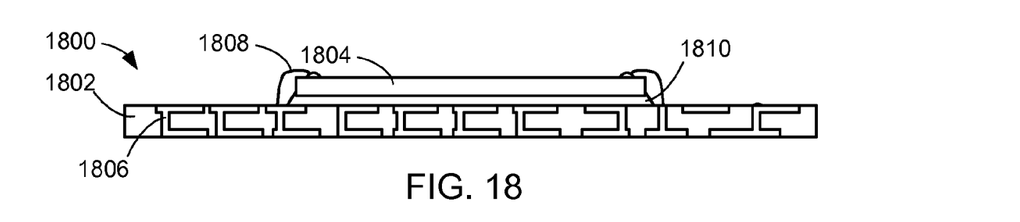
FIG. 18 is a cross-sectional view of an integrated circuit package system in an attachment phase.

Referring now to FIG. 18, therein is shown a cross-sectional view of an integrated circuit package system 1800 in an attachment phase. The integrated circuit package system 1800 preferably includes a package substrate 1802 with a package die 1804 thereover.

The package die 1804 can be electrically connected to package substrate conductors 1806 with package die connectors 1808 and attached over a package die attach material 1810. The package die attach material 1810 provides a substantially fixed position for processing.

Figure 19:
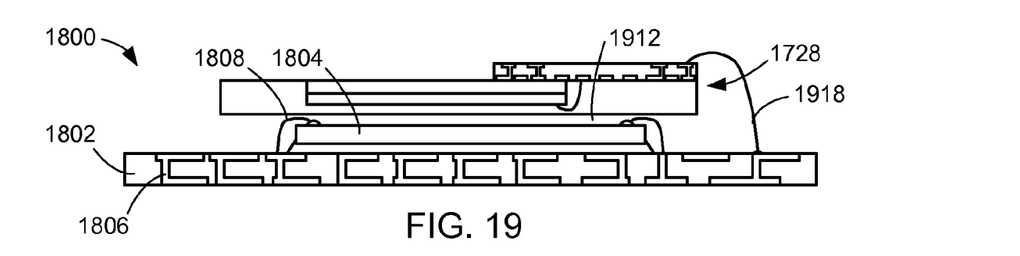
FIG. 19 is the structure of FIG. 18 in a module attach phase.

Referring now to FIG. 19, therein is shown the structure of FIG. 18 in a module attach phase. A module interface material 1912 can attach or mount the stack module 1728 over the package die 1804. The module interface material can cover or protect a portion of the package die connectors 1808.

Stack connectors 1918 can electrically connect the stack module 1728 to the package substrate conductors 1806 of the package substrate 1802. The stack module 1728 can thereby be electrically connected through the package substrate 1802.

Figure 20:
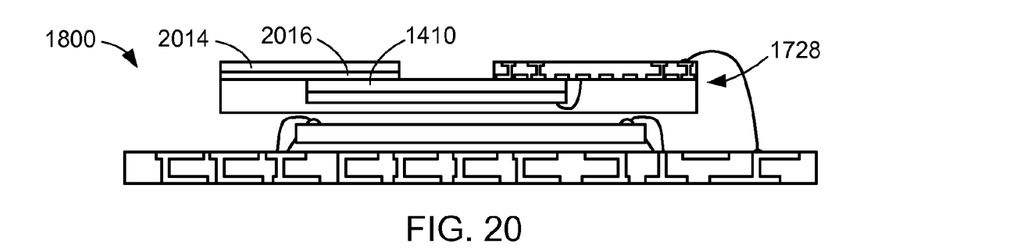
FIG. 20 is the structure of FIG. 19 in a device mount phase.

Referring now to FIG. 20, therein is shown the structure of FIG. 19 in a device mount phase. A stack device 2014 can be attached or mounted over the module die attach material 1410 with a device interface material 2016. The device interface material 2016 can be applied on the stack device 2014 and the module die attach material 1410.

The stack module 1728 can provide the module die attach material 1410 substantially exposed although the module die attach material 1410 may or may not include adhesive properties during this phase.

Figure 21:
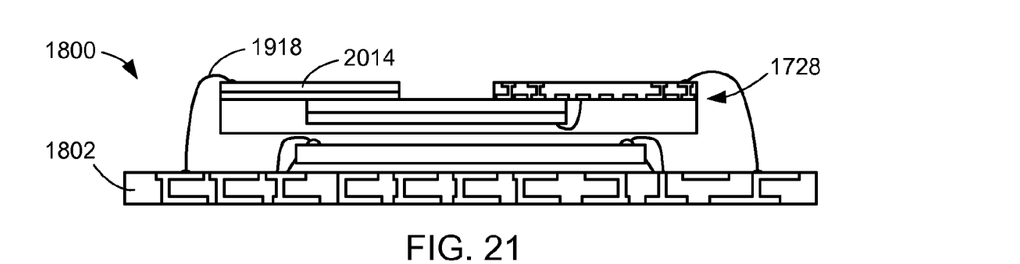
FIG. 21 is the structure of FIG. 19 in a device connect phase.

Referring now to FIG. 21, therein is shown the structure of FIG. 19 in a device connect phase. The stack connectors 1918 can electrically connect the stack device 2014 and the package substrate 1802.

For illustrative purposes the stack connectors 1918 attached to the stack device 2014 are shown as substantially the same as the stack connectors 1918 attached to the stack module 1728 although it is understood that the stack connectors 1918 attached to the stack device 2014 may be different from the stack connectors 1918 attached to the stack module 1728.

Figure 22:
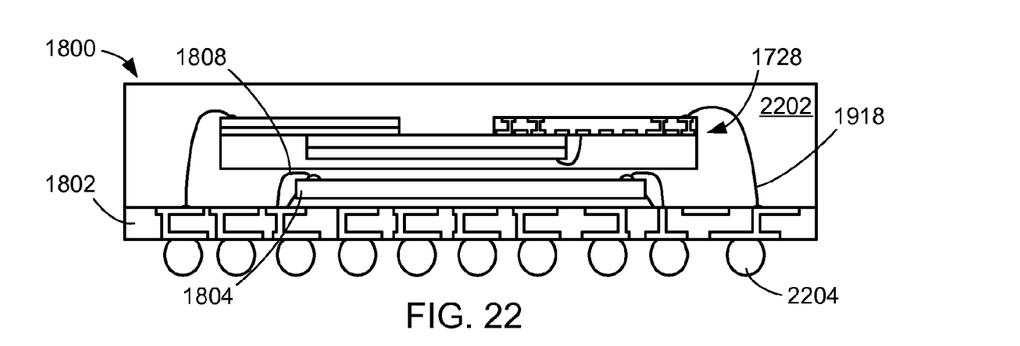
FIG. 22 is the structure of FIG. 21 in an encapsulation phase.

Referring now to FIG. 22, therein is shown the structure of FIG. 21 in an encapsulation phase. A package encapsulant 2202 can be formed over the stack module 1728, the stack connectors 1918, the package die 1804, the package die connectors 1808, and part of the package substrate 1802.

Package connectors 2204 can also be attached over a side of the package substrate 1802 opposite the package encapsulant 2202. The package connectors 2204 can provide electrical connectivity to a next level system such as another package or printed circuit board.

Figure 23:
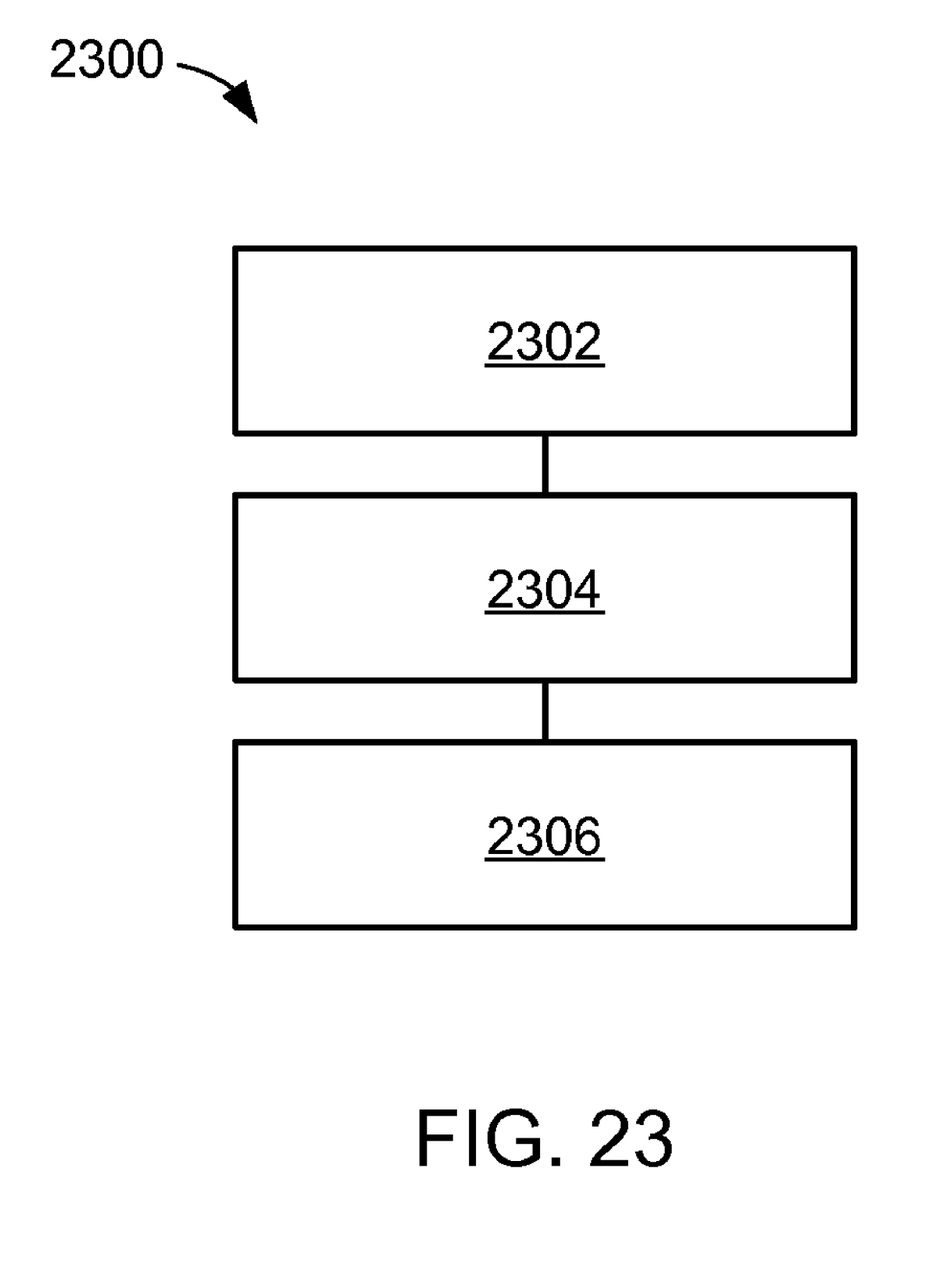
FIG. 23 therein is shown a flow chart of an integrated circuit package system for manufacturing the integrated circuit package system in an embodiment of the present invention.

Referring now to FIG. 23, therein is shown a flow chart of an integrated circuit package system 2300 for manufacturing the integrated circuit package system 100 in an embodiment of the present invention. The system 2300 includes providing a module substrate having dimension predetermined for attachment adjacent a device in a block 2302; attaching a module die adjacent the module substrate in a block 2304; and applying a module molding material cantilevered from the module substrate and over the module die in a block 2306.

In greater detail, a system to provide the method and apparatus of the integrated circuit package system 100, in an embodiment of the present invention, is performed as follows:

1. Forming a module substrate having a module substrate edge and dimensions predetermined for attachment adjacent a device.
2. Mounting a module die having a module die edge adjacent the module substrate edge.

3. Connecting a module die connector to the module die and the module substrate.

4. Forming a module molding material cantilevered from the module substrate and over the module die wherein the module substrate conductor and the module die attach material are partially exposed.

Thus, it has been discovered that the integrated circuit package system method and apparatus of the present invention furnish important and heretofore unknown and unavailable solutions, capabilities, and functional aspects.

The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description.

Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
    providing a module substrate having a module substrate internal surface and dimensions predetermined for attachment adjacent a device;
    attaching a module die having a module die connect surface and adjacent the module substrate; and
    applying a module molding material cantilevered from the module substrate and over the module die, the module molding material directly on substantially all of the module substrate internal surface and the module die connect surface.

2. The method as claimed in claim 1 wherein attaching the module die includes attaching the module die next to the module substrate.

3. The method as claimed in claim 1 wherein attaching the module die includes attaching the module die partially over the module substrate.

4. The method as claimed in claim 1 further comprising:
    providing a package substrate;
    attaching a package die over the package substrate; and
    attaching the module molding material over the package die.

5. The method as claimed in claim 1 further comprising attaching a stack device over the module die.

6. A method for manufacturing an integrated circuit package system comprising:
    forming a module substrate having a module substrate conductor, a module substrate edge, a module substrate internal surface, and dimensions predetermined for attachment adjacent a device;
    forming a module die attach material adjacent the module substrate;
    mounting a module die having a module die connect surface and a module die edge adjacent the module substrate edge and over the module die attach material; and
    forming a module molding material cantilevered from the module substrate and over the module die wherein the module substrate conductor and the module die attach material are partially exposed, the module molding material directly on substantially all of the module substrate internal surface and the module die connect surface.

7. The method as claimed in claim 6 wherein attaching the module die includes attaching the module die wherein the module die edge faces the module substrate edge.

8. The method as claimed in claim 6 wherein attaching the module die includes attaching the module die offset from the module substrate having the module die edge over the module substrate edge.

9. The method as claimed in claim 6 further comprising:
    providing a package substrate having package connectors;
    attaching a package die over the package substrate on a side opposite the package connectors; and
    attaching a stack module having the module molding material over the package die.

10. The method as claimed in claim 6 further comprising attaching a stack device over the module die attach material.

11. An integrated circuit package system comprising:
    a module substrate having a module substrate internal surface and dimensions predetermined for attachment adjacent a device;
    a module die having a module die connect surface and adjacent the module substrate; and
    a module molding material cantilevered from the module substrate and over the module die, the module molding material directly on substantially all of the module substrate internal surface and the module die connect surface.

12. The system as claimed in claim 11 wherein the module die is next to the module substrate.

13. The system as claimed in claim 11 wherein the module die is partially over the module substrate.

14. The system as claimed in claim 11 further comprising:
    a package substrate; and
    a package die over the package substrate wherein the module molding material is over the package die.

15. The system as claimed in claim 11 further comprising a stack device over the module die.

16. The system as claimed in claim 11 wherein:
    the module substrate has a module substrate conductor, a module substrate edge, and dimensions predetermined for attachment adjacent a device; and further comprising:
    a module die attach material adjacent the module substrate;
    the module die having a module die edge adjacent the module substrate edge and over the module die attach material; and
    the module molding material cantilevered from the module substrate and over the module die wherein the module substrate conductor and the module die attach material are partially exposed.

17. The system as claimed in claim 16 wherein the module die edge faces the module substrate edge.

18. The system as claimed in claim 16 wherein the module die is offset from the module substrate having the module die edge over the module substrate edge.

19. The system as claimed in claim 16 further comprising:
    a package substrate having package connectors;
    a package die over the package substrate on a side opposite the package connectors; and
    a stack module having the module molding material over the package die.

20. The system as claimed in claim 16 further comprising a stack device over the module die attach material wherein the module die attach material is over the module die.

* * * * *